United States Patent
Song et al.

(10) Patent No.: US 7,517,593 B2
(45) Date of Patent: *Apr. 14, 2009

(54) DONOR SUBSTRATE FOR LASER INDUCED THERMAL IMAGING METHOD AND ORGANIC ELECTROLUMINESCENT DISPLAY DEVICE FABRICATED USING THE SAME

(75) Inventors: Myung-Won Song, Suwon-si (KR); Ho-Kyoon Chung, Suwon-si (KR); Seong-Taek Lee, Suwon-si (KR); Mu-Hyun Kim, Suwon-si (KR); Byung-Doo Chin, Suwon-si (KR); Tae-Min Kang, Suwon-si (KR); Jae-Ho Lee, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 542 days.

This patent is subject to a terminal disclaimer.

(21) Appl. No.: 11/009,698

(22) Filed: Dec. 13, 2004

(65) Prior Publication Data
US 2006/0051533 A1    Mar. 9, 2006

(30) Foreign Application Priority Data
Sep. 8, 2004    (KR)    .............. 10-2004-0071882

(51) Int. Cl.
*B32B 25/20*    (2006.01)
*H01J 1/62*    (2006.01)
*C09K 11/06*    (2006.01)

(52) U.S. Cl. .............. 428/690; 428/32.81; 428/156; 428/917; 313/504; 313/506; 430/200

(58) Field of Classification Search .............. 428/690, 428/917, 106, 32.81, 156, 503, 530; 430/200; 313/504, 506
See application file for complete search history.

(56) References Cited

U.S. PATENT DOCUMENTS 5,220,348 A    6/1993    D'Aurelio .............. 347/236

(Continued)

FOREIGN PATENT DOCUMENTS

CN    1199507    11/1998

(Continued)

OTHER PUBLICATIONS

Pusch, C, European Search Report for European Patent Application No. EP 04090507, dated May 24, 2005.

(Continued)

*Primary Examiner*—D. L Tarazano
*Assistant Examiner*—Camie S Thompson
(74) *Attorney, Agent, or Firm*—Robert E. Bushnell, Esq.

(57) ABSTRACT

A donor substrate for a laser induced thermal imaging method and an organic electroluminescent display device fabricated using the same are provided. The donor substrate may be constructed with base film; a light-to-heat conversion layer formed on the base film; a buffer layer formed on the entire surface of the light-to-heat conversion layer; a metal layer formed on the buffer layer; and a transfer layer formed of an organic material and formed on the metal layer, thereby enhancing the characteristics of a transfer pattern by transferring a small molecular material using the laser induced thermal imaging method.

20 Claims, 9 Drawing Sheets

U.S. PATENT DOCUMENTS

| | | | | |
|---|---|---|---|---|
| 5,256,506 | A | 10/1993 | Ellis et al. | 430/20 |
| 5,278,023 | A | 1/1994 | Bills et al. | 430/201 |
| 5,308,737 | A | 5/1994 | Bills et al. | 430/201 |
| 5,688,551 | A | 11/1997 | Littman et al. | 427/64 |
| 5,937,272 | A | 8/1999 | Tang | 430/30 |
| 5,981,136 | A | 11/1999 | Chang et al. | 430/2 |
| 5,998,085 | A | 12/1999 | Isberg et al. | 430/200 |
| 6,099,994 | A | 8/2000 | Chang et al. | 430/20 |
| 6,114,088 | A | 9/2000 | Wolk et al. | 430/273.1 |
| 6,194,119 | B1 * | 2/2001 | Wolk et al. | 430/200 |
| 6,214,520 | B1 | 4/2001 | Wolk et al. | 430/273.1 |
| 6,461,793 | B2 | 10/2002 | Chang et al. | 430/271.1 |
| 6,485,884 | B2 * | 11/2002 | Wolk et al. | 430/200 |
| 2002/0160296 | A1 | 10/2002 | Wolk et al. | 430/200 |
| 2005/0118525 | A1 * | 6/2005 | Kim et al. | 430/200 |
| 2006/0043881 | A1 * | 3/2006 | Chin et al. | 313/503 |

FOREIGN PATENT DOCUMENTS

| | | |
|---|---|---|
| CN | 1474639 | 2/2004 |
| CN | 1510973 | 7/2004 |
| EP | 0773707 A2 | 5/1997 |
| EP | 0858110 A1 | 8/1998 |
| EP | 1432049 A2 | 6/2004 |
| JP | 10-125929 | 5/1998 |
| JP | 10-208881 | 8/1998 |
| JP | 2004-509430 | 3/2004 |
| KR | 1020000034508 | 6/2000 |
| WO | WO 02/22372 | 3/2002 |
| WO | WO 02/070271 A2 | 9/2002 |

OTHER PUBLICATIONS

Office action from the Chinese Patent Office issued in Applicant's corresponding Chinese Patent Application No. 2004100954533 dated Mar. 21, 2008.

Office action from the Japanese Patent Office issued in Applicant's corresponding Japanese Patent Application No. 2004-378201 dated Apr. 22, 2008.

* cited by examiner

DONOR SUBSTRATE FOR LASER INDUCED THERMAL IMAGING METHOD AND ORGANIC ELECTROLUMINESCENT DISPLAY DEVICE FABRICATED USING THE SAME

CLAIM OF PRIORITY

This application makes reference to, incorporates the same herein, and claims all benefits accruing under 35 U.S.C. §119 from an application earlier filed in the Korean Intellectual Property Office on 8 Sep. 2004 and there duly assigned Serial No. 2004-71882.

BACKGROUND OF THE INVENTION

1. Field of the Invention

The present invention relates to a donor substrate for a laser induced thermal imaging (LITI) method and an organic electroluminescent (EL) display device fabricated using the same and, more particularly, to a donor substrate used for forming an organic layer of an organic electroluminescent display device, and an organic electroluminescent display device fabricated using the same.

2. Description of the Related Art

In general, an organic electroluminescent (EL) display device includes various layers such as an anode, a cathode, a hole injection layer, a hole transport layer, an emission layer, an electron transport layer, an electron injection layer, etc.

The organic EL display device is classified into a polymer device and a small molecular organic EL device according to materials. In the case of the small molecular device, each layer is introduced by a vacuum deposition process. In the case of a polymer organic EL display device, an EL element is fabricated by a spin coating process.

In the case of a mono-color display device, the polymer organic EL display device may be easily fabricated by the spin coating process and driven at relatively low voltage compared to the small molecular organic EL display device, but is lowered in efficiency and lifetime. On the other hand, in the case of a full-color display device, red, green and blue polymers should be patterned, respectively. However, an ink jet method or a laser induced thermal imaging method is not preferable because it deteriorates luminescence characteristics such as efficiency, lifetime, etc. of the organic EL display device.

In particular, most single polymer material is hardly transferred by the laser induced thermal imaging method. Various methods for patterning the polymer organic EL display device using the laser induced thermal imaging method are disclosed in Korean Patent No. 1998-51844, and U.S. Pat. Nos. 5,998,085, 6,214,520, and 6,114,088.

The laser induced thermal imaging method requires at least a light source, a transfer film, and a substrate, wherein light emitted from the light source is absorbed in a light absorption layer of the transfer film and transformed into heat energy, so that the heat energy transfers a material for forming a transfer layer from the transfer film to the substrate, thereby forming a desired image (refer to U.S. Pat. Nos. 5,220,348, 5,256,506, 5,278,023, and 5,308,737).

Such a laser induced thermal imaging method has been used in fabricating a color filter for a liquid crystal display device, or in patterning an EL material (refer to U.S. Pat. No. 5,998,085).

U.S. Pat. No. 5,937,272 relates to a method of forming a highly patterned organic layer in a full-color organic EL display device, in which an organic EL material employs a donor support coated with a transferable material. In this method, the donor support is heated to transfer the organic EL material to a recessed portion of a substrate corresponding to a desired lower pixel, wherein the recessed portion is provided for forming a colored organic EL medium. At this time, the transfer is accomplished by applying heat or light to the donor support to vaporize the organic EL material, thereby transferring it to the pixel.

U.S. Pat. No. 5,688,551 relates to a method of forming a sub-pixel formed in each pixel region, in which the organic EL material is transferred from a donor sheet to a receiver sheet, thereby forming the sub-pixel. At this time, the transfer is performed at a low temperature of about 400° C. or less, and a sublimatable organic EL material is transferred from the donor sheet to the receiver sheet, thereby forming the sub-pixel.

SUMMARY OF THE INVENTION

The present invention, therefore, solves aforementioned problems associated with conventional display devices by providing a donor substrate for a laser induced thermal imaging method capable of transferring without non-transferred region when an emission layer is formed by a laser induced thermal imaging method in fabricating an organic EL display device It is therefore, an object of the present invention to provide an improved donor substrate for a laser induced thermal imaging method.

In an exemplary embodiment of the present invention, a donor substrate for a laser induced thermal imaging method may be constructed with a base film; a light-to-heat conversion layer formed on the base film; a buffer layer formed on the entire surface of the light-to-heat conversion layer; a metal layer formed on the buffer layer; and a transfer layer formed of an organic material and formed on the metal layer.

In another exemplary embodiment of the present invention, a donor substrate for a laser induced thermal imaging method may be constructed with a base film; a light-to-heat conversion layer; a buffer layer; and a transfer layer, wherein a modified layer for modifying a surface of the buffer layer is interposed between the buffer layer and the transfer layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
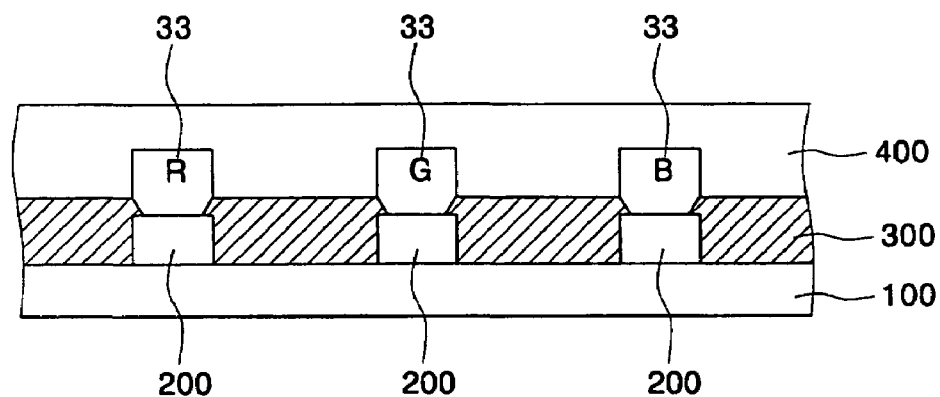
FIG. 1 is a cross-sectional view of a general full-color organic EL display device.

FIG. 1 is a cross-sectional view of a general full-color organic EL display device.

Referring to FIG. 1, a first electrode 200 is patterned on an insulating substrate 100. The first electrode 200 is formed of a transparent electrode in the case of a bottom emitting structure, and formed of a conductive metal layer including a reflective layer in the case of a top emitting structure.

Then, a pixel defining layer (PDL) 300 is formed on the first electrode 200 to define a pixel region, and made of an insulating material for insulation of an emission layer.

Then, an organic layer 33 having red, green and blue organic emission layers R, G and B is formed on the pixel region defined by the pixel defining layer 300. The organic layer 33 may include at least one layer of a hole injection layer, a hole transport layer, a hole blocking layer, an electron transport layer, and an electron injection layer in addition to the organic emission layer. Here, both polymer and small molecular materials may be used to form the organic emission layer.

Then, a second electrode 400 is formed on the organic layer 33. The second electrode 400 is formed of a conductive metal layer including a reflective layer when the first electrode 200 is a transparent electrode, and formed of a transparent electrode when the first electrode 200 is a conductive metal layer including a reflective layer. Then, the organic EL display device is encapsulated, thereby completing the organic EL display device.

Figure 2:
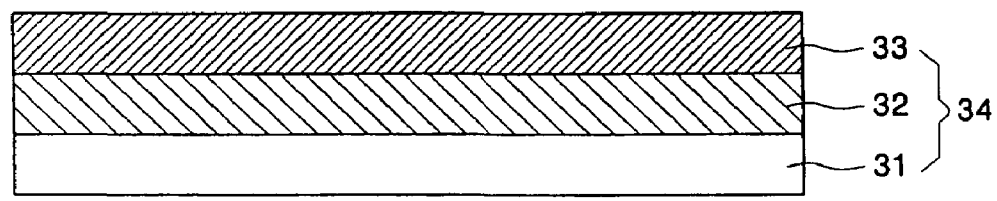
FIG. 2 is a cross-sectional view illustrating a structure of a conventional donor substrate for a laser induced thermal imaging method.

Alternatively, when the emission layer is formed by the conventional laser induced thermal imaging method, as shown in FIG. 2, a conventional donor substrate 34 for a laser induced thermal imaging method includes a base film 31, a light-to-heat conversion layer 32, and a transfer layer 33, and may further include a buffer layer (not shown).

Meanwhile, U.S. Pat. Nos. 5,981,136, 6,461,793, 6,099,994 employ a buffer layer or an interlayer provided between the light-to-heat conversion layer 32 and the transfer layer 33 to prevent contaminants from being transferred from the light-to-heat conversion layer 32 to the organic transfer layer 33, wherein the buffer layer or the interlayer includes a metal layer. However, the foregoing patents do not divide the polymer and small molecular materials, so that the following problem arises when the small molecular material is used.

Figure 3:
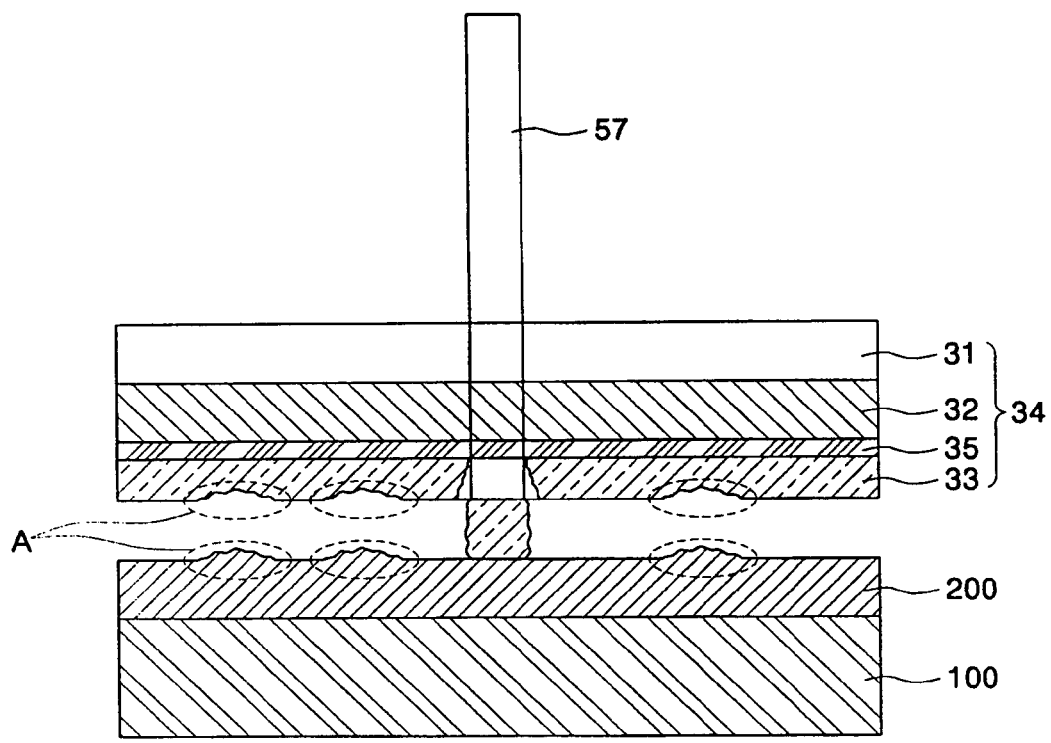
FIG. 3 illustrates a transfer model of the conventional donor substrate having a small molecular transfer layer.

FIG. 3 illustrates a transfer model of the conventional donor substrate. Referring to FIG. 3, when the light-to-heat conversion layer 32 is expanded by a laser beam, the transfer layer 33 is also expanded and separated from the donor substrate, thereby being transferred to a substrate of the organic EL display device.

However, when the small molecular material is used as the transfer layer 33 of the conventional donor substrate, adhesion between the surface of the donor substrate and the small molecular transfer layer 33 deteriorates, so that the substrate of the organic EL display device is stained with the organic small molecular material on the donor substrate during a laminating process. Thus, the unwanted organic small molecular material stains the substrate to which the transfer layer 33 has not to be transferred by the laser beam, thereby directly deteriorating the performance of the display device.

Figure 4:
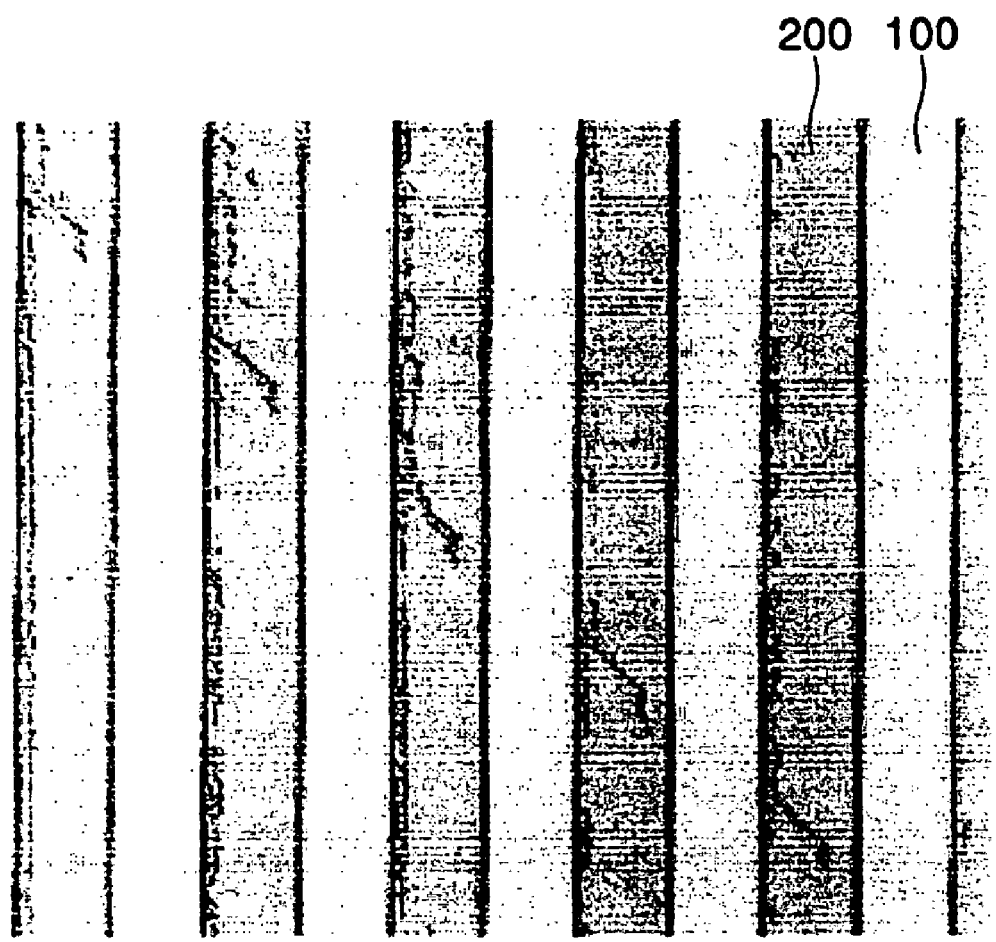
FIG. 4 is a photograph showing a pattern obtained by applying a laser induced thermal imaging method to a small molecular material using a conventional donor substrate.

FIG. 4 is a photograph showing a pattern obtained by applying a laser induced thermal imaging method to a small molecular material using the conventional donor substrate.

Referring to FIG. 4, the entire surface of a substrate 100 is stained with the transferred small molecular material, so that the pixel is indistinguishably defined.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 5:
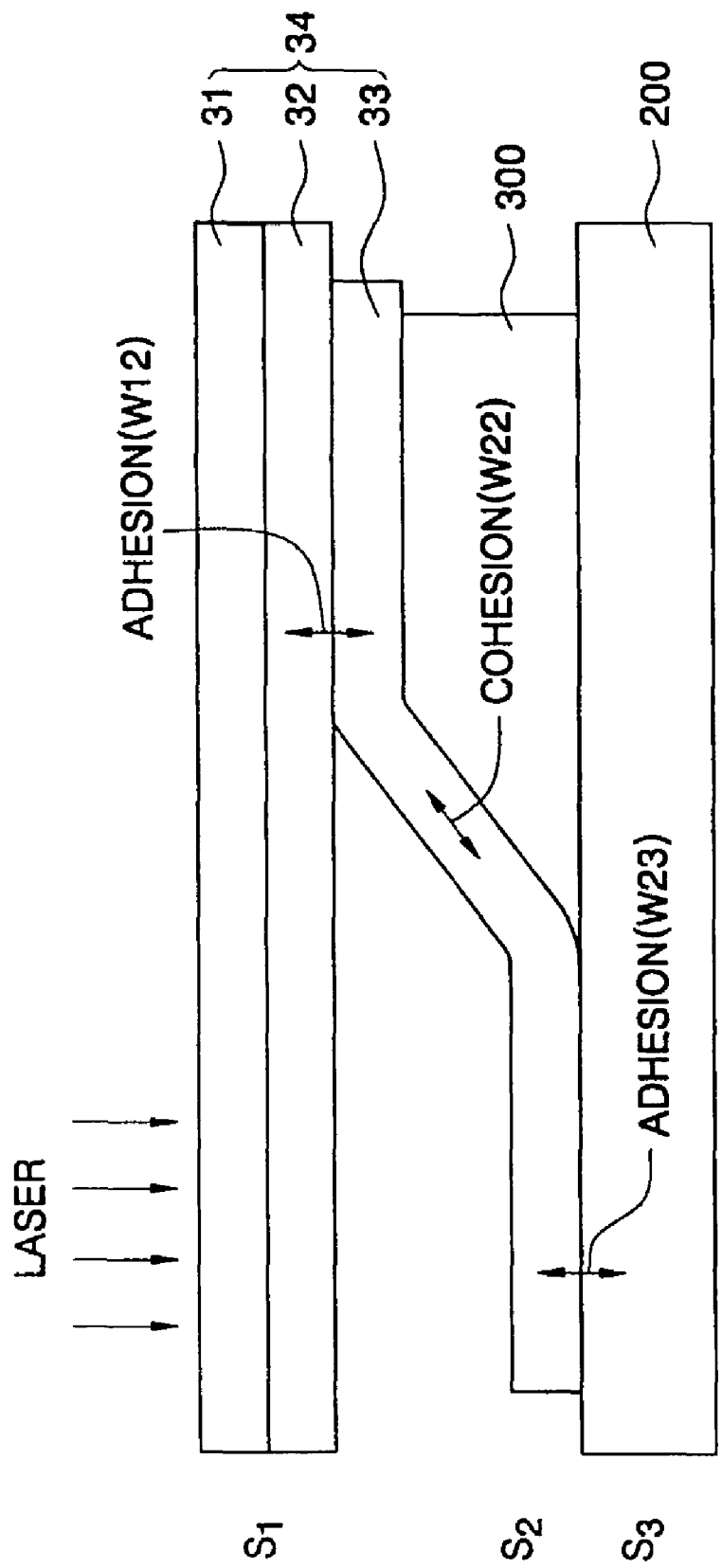
FIG. 5 illustrates a transfer mechanism for transferring an organic emission layer used in an organic EL display device using a laser beam according to the present invention.

FIG. 5 illustrates a transfer mechanism for transferring an organic emission layer used in an organic EL display device according to the present invention.

In general, a mechanism for transferring and patterning an organic layer using a laser is as follows. As shown in FIG. 5, an organic layer S2 attached to a substrate S1 is separated from the substrate S1 by the laser, and transferred to a substrate S3 to be separated from a region not affected by the laser beam.

As a factor affecting the transfer characteristics, there are a first adhesion W12 between the substrate S1 and the organic layer S2, a cohesion W22 of the organic layer S2 itself, and a second adhesion W23 between the organic layer S2 and the substrate S3.

The first adhesion, the cohesion, and the second adhesion may be represented with surface tensions $\gamma 1$, $\gamma 2$ and $\gamma 3$ and interfacial tensions $\gamma 12$ and $\gamma 23$, as follows:

$$W12 = \gamma 1 + \gamma 2 - \gamma 12$$

$$W22 = 2\gamma 2$$

$$W23 = \gamma 2 + \gamma 3 - \gamma 23$$

To improve the transfer characteristics, the cohesion should be smaller than each of the first and second adhesions.

In general, each layer of the organic EL display device is formed of an organic material. In the case of using a small molecular material, the first and second adhesions are larger than the cohesion, so that an EL material is transferred from a donor substrate 34 to the organic EL display device, thereby causing a mass transition and forming a fine pattern of the emission layer. Through this transfer, the emission layer may be finely patterned and decrease misalignment.

Figure 6:
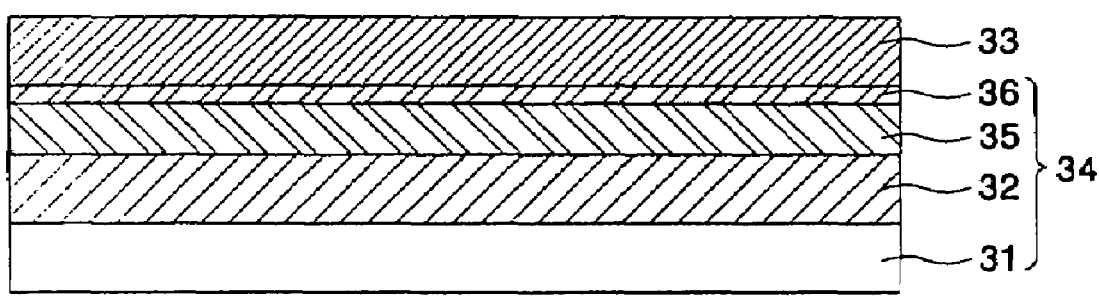
FIG. 6 is a cross-sectional view illustrating a structure of a donor substrate for a laser induced thermal imaging method according to a first embodiment of the present invention.

FIG. 6 is a cross-sectional view illustrating a structure of a small molecular donor substrate for a laser induced thermal imaging method according to a first embodiment of the present invention.

Referring to FIG. 6, the donor substrate 34 includes a base film 31, a light-to-heat conversion layer 32 formed on the base film 31, a buffer layer 35 formed on the light-to-heat conversion layer 32 over the entire surface of the base film 31, a metal layer 36 formed on the entire surface of the buffer layer 35, and a transfer layer 33 formed of an organic material and formed on the metal layer 36, which are sequentially stacked.

According to the first embodiment of the present invention, a small molecular organic material is used as the organic material, wherein the small molecular organic material forms at least one layer of a hole transport layer, a hole injection layer, an emission layer, a hole blocking layer, an electron transport layer, and an electron injection layer.

In the case where a small molecular organic EL material is used as the organic material, the small molecular organic EL material may be formed of either: materials represented as the following chemical formulas 1 through 4; or a small molecular phosphorescent material employing a phosphorescent dopant such as one organic metal complex selected from a group consisting of Ir, Pt, Eu, and Tb, which is capable of emitting phosphorescence in a triplet state, together with a luminescent host material such as carbazole-based, arylamine-based, hydrazone-based, stilbene-based, starburst-based, or oxadiazole-based material.

[Chemical Formula 1]

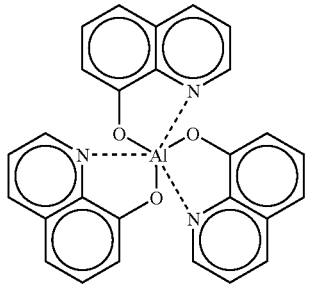

[Chemical Formula 2]

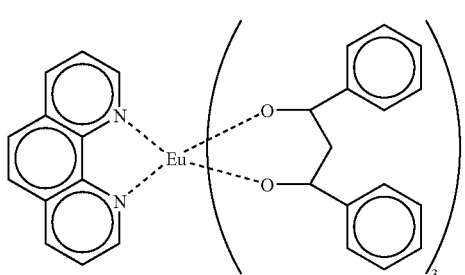

[Chemical Formula 3]

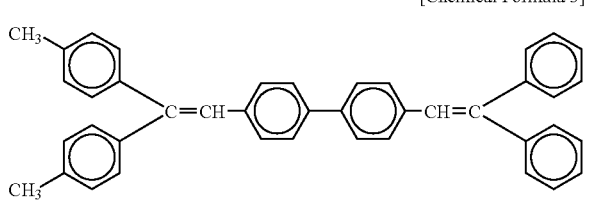

[Chemical Formula 4]

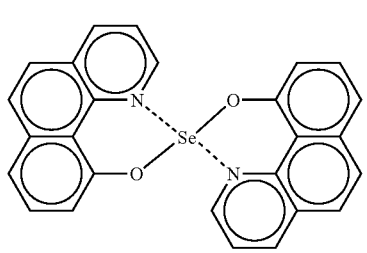

At this time, the transfer layer 33 is formed to a thickness of 100 through 50,000 Å by a typical coating method, for example, extrusion, spin, knife coating, vacuum deposition, chemical vapor deposition, etc.

Meanwhile, the film structure of the donor substrate shown in FIG. 6 may vary according to a use. For example, a gas generating layer (not shown) may be further formed beneath the light-to-heat conversion layer to enhance sensitivity of the film, and a buffer layer (not shown) may be interposed between the metal layer 36 and the transfer layer 33.

The base film 31 is made of a transparent polymer such as, polyester including polyethylene terephthalate; polyacryl; polyepoxy; polyethylene; polystyrene, etc. Among them, the polyethylene terephthalate is mostly used as the base film 31. Preferably, the base film 31 has a thickness of 10 through 500 μm. Here, the base film 31 functions as a supporting film. Alternatively, the base film 31 may include complexes.

The light-to-heat conversion layer 32 is formed of a light absorbing material capable of absorbing infrared to visible light, which is one of an organic layer, a metal layer, and a combined layer thereof including a laser absorbing material.

As a film having the foregoing characteristics, there is a polymer organic layer containing metal, metal oxide, metal sulfide, carbon black, graphite, or infrared dye.

Here, the metal includes Al, Sn, Ni, Ti, Co, Zn, Pb, etc. having an optical density of 0.2 through 3.0, and the metal oxide and sulfide include the oxide and the sulfide of the metals. Preferably, the polymer organic layer includes Al or aluminum oxide.

The polymer organic layer containing the carbon black, the graphite, or the infrared dye is made of a polymer binding resin containing a coloring agent such as pigment, dye, or the like; and a dispersing agent. Here, the polymer binding resin includes only (meta)acrylate oligomer such as acryl-(meta)acrylate oligomer, ester-(meta)acrylate oligomer, epoxy-(meta)acrylate oligomer, urethane-(meta)acrylate oligomer, or the like. Alternatively, the polymer binding resin may include a mixture of the foregoing oligomer and (meta)acrylate monomer, or only (meta)acrylate monomer. Further, the carbon black or the graphite preferably has a diameter of 0.5 μm or less, and an optical density of 0.5 through 4.

Meanwhile, when the light-to-heat conversion layer 32 is too thin, its energy absorptivity is lowered, so that the amount of heat energy transformed from light energy is decreased, thereby decreasing the tension. Further, the amount of energy transmitted through the light-to-heat conversion layer 32 is increased, thereby damaging a circuit of the organic EL display device.

Also, while the transfer layer is transferred and expanded by the energy of the laser beam, the transfer layer should be kept to have a predetermined thickness or less in order to decrease a curvature radius of the transfer layer, thereby preventing an edge open defect due to a step of the pixel defining layer of the organic EL display device.

On the other hand, when the light-to-heat conversion layer 32 is too thick, the laser beam cannot be uniformly transmitted throughout the light-to-heat conversion layer 32, thereby deteriorating the transfer characteristics. In particular, when the light-to-heat conversion layer 32 is too thickly formed, coherence between the film and the substrate is poor at the step of the pixel defining layer to define the pixel region of the organic EL display device, so that the edge open defect is likely to arise.

Thus, in the case where the light-to-heat conversion layer 32 is made of the metal, the metal oxide or the metal sulfide, the light-to-heat conversion layer 32 is formed to a thickness of 100 through 5,000 Å using a vacuum deposition method, an electron beam deposition method, or a sputtering method. Further, in the case where the light-to-heat conversion layer 32 is made of an organic layer, the light-to-heat conversion layer 32 is formed to a thickness of 0.1 through 1 μm by extrusion, spin, knife coating, vacuum deposition, chemical vapor deposition, etc.

Further, when the gas generating layer causes decomposition reaction by absorbing light or heat, a nitrogen gas, a hydrogen gas, etc. are generated to provide transfer energy. Here, the gas generating layer may be made of a material selected from the pentaerythrite tetranitrate (PETN), tri nitro toluene (TNT), etc.

The buffer layer 35 may be formed on the light-to-heat conversion layer 132. The buffer layer 35 may be formed to enhance the interfacial characteristics between the light-to-heat conversion layer 32 and the metal layer 36. Here, the buffer layer 35 may be formed of metal oxide, metal sulfide, nonmetallic inorganic compounds, or organic material, wherein the metal oxide or the like is formed by oxidizing a surface of the metal layer after forming the metal layer, or by a separate process. Further, the organic material may be formed by coating an inert polymer or by depositing a small molecular material. Preferably, the buffer layer 35 has a thickness of 0.01 through 2 μm.

Meanwhile, the metal layer 36 formed on the buffer layer 35 throughout the base film includes metal having a laser beam transmissivity of 20% or less. Further, the metal layer 36 is formed to have a thickness of 1 μm or less by a vacuum deposition method, an electron beam deposition method, or a sputtering method. Here, when the metal layer 36 is too thick, the metal layer 36 is hardly expanded while the light-to-heat conversion layer 32 is expanded, thereby deteriorating the transfer characteristics. Therefore, the thickness of the metal layer 36 is determined as long as it may prevent the light energy of the laser beam and the heat energy of the light-to-heat conversion layer 32 from being transferred to the transfer layer 33 and prevent the transfer layer 33 from being thermally deformed.

At this time, the metal layer 36 enhances the adhesion between the small molecular transfer layer 33 and the donor substrate 34 to prevent the small molecular transfer layer 33 from staining a region to which the transfer layer 33 is not transferred.

The metal layer 36 may include one of Al, Ag, Cr, Sn, Ni, Ti, Co, Zn, Au, Cu, W, Mo, and Pb, and preferably includes Al or Ag.

Figure 7:
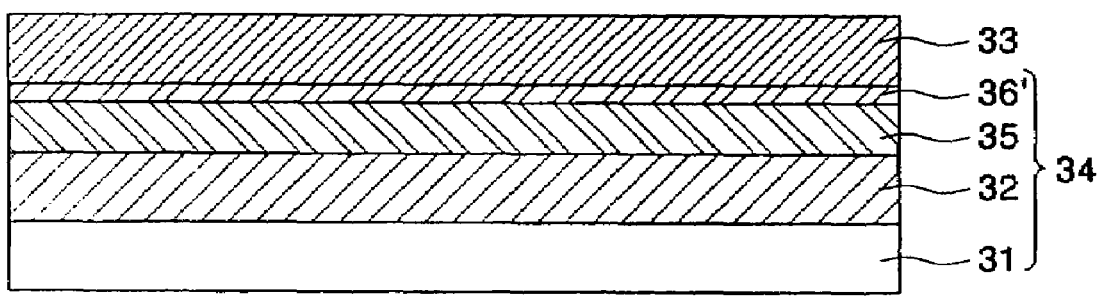
FIG. 7 is a cross-sectional view of a donor substrate for a laser induced thermal imaging method according to a second embodiment of the present invention.

FIG. 7 is a cross-sectional view of a donor substrate for a laser induced thermal imaging method according to a second embodiment of the present invention.

Referring FIG. 7, a donor substrate 34 according to the second embodiment of the present invention includes a base film 31, a light-to-heat conversion layer 32, a buffer layer 35, and a transfer layer 33, and further includes a modified layer 36' formed between the buffer layer 35 and the transfer layer 33 to modify the surface of the buffer layer 35.

According to the second embodiment of the present invention, the transfer layer 33 includes a small molecular organic material, wherein the small molecular material forms at least one of a hole transport layer, a hole injection layer, an emission layer, a hole blocking layer, an electron transport layer, and an electron injection layer.

In the case where the small molecular organic EL material is used as the small molecular organic material, the small molecular organic material may be formed of either: materials represented as the following chemical formulas 1 through 4; or a small molecular phosphorescent material employing a phosphorescent dopant such as one organic metal complex selected from a group consisting of Ir, Pt, Eu, and Tb, which is capable of emitting phosphorescence in a triplet state, together with a luminescent host material such as carbazole-based, arylamine-based, hydrazone-based, stilbene-based, starburst-based, or oxadiazole-based material.

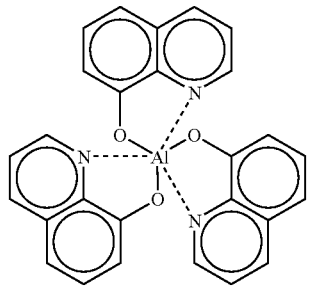

[Chemical Formula 1]

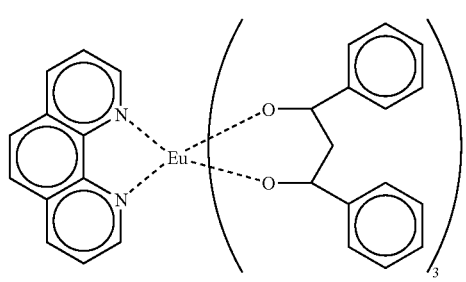

[Chemical Formula 2]

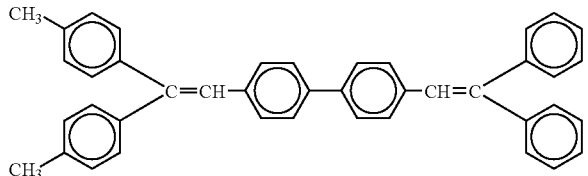

[Chemical Formula 3]

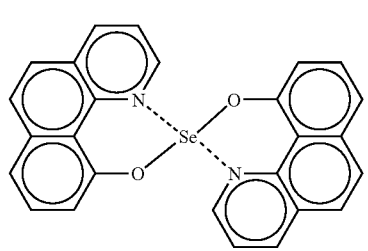

[Chemical Formula 4]

At this time, the transfer layer 33 is formed to a thickness of 100 through 50,000 Å by extrusion, spin, knife coating, vacuum deposition, chemical vapor deposition, etc.

The modified layer 36' may be formed of an organic material, an inorganic material, or metal as long as it may enhance the interfacial characteristics between the small molecular transfer layer 33 and the donor substrate 34, in particular, the adhesion therebetween.

The modified layer 36' includes one of Al, Ag, Cr, Sn, Ni, Ti, Co, Zn, Au, Cu, W, Mo, Pb and their oxides, and preferably includes either Al or Ag.

The thickness of the modified layer 36' may vary according to used materials. However, the modified layer 36' preferably has a thickness of 1 μm or less in consideration of transmissivity of the leaser beam, the characteristics a transfer pattern, etc.

The other configurations according to the second embodiment are formed by the same material and method as those of the first embodiment.

Thus, the donor substrate for the laser induced thermal imaging method according to an embodiment of the present invention allows the organic EL display device to easily have a fine pattern, in particular, in the case where the organic EL display device includes an EL element made of a small molecular organic material.

Hereinbelow, a method of forming a fine pattern of a small molecular organic thin film using a donor substrate according to an embodiment of the present invention will be described with reference to FIG. 8. In the following description, the donor substrate according to an embodiment of the present invention is applied to the organic EL display device for the sake of description, but not limited to and may vary.

Figure 8:
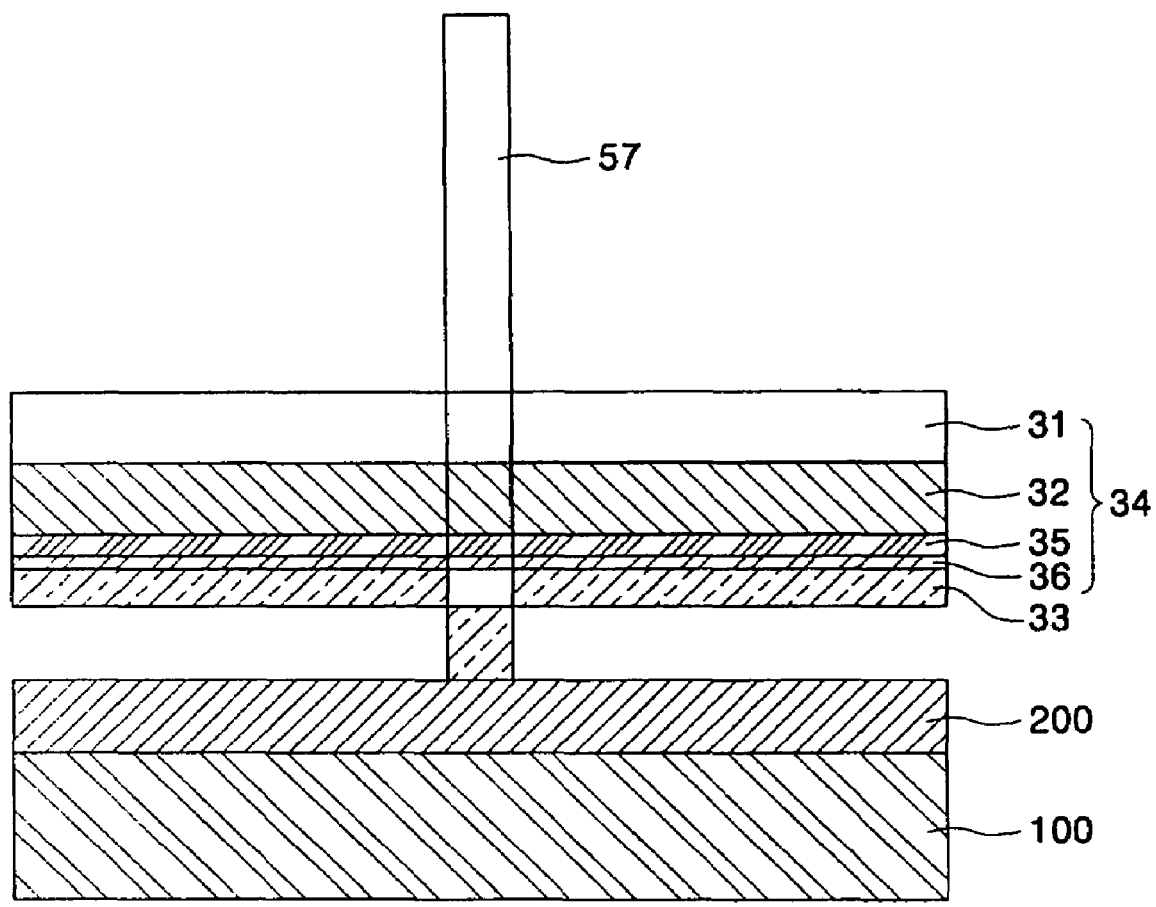
FIG. 8 illustrates a method of transferring using a donor substrate according to an embodiment of the present invention.

FIG. 8 is a view illustrating a transferring method using a donor substrate according to an embodiment of the present invention. First, a transparent electrode layer 200 is formed on a transparent substrate 100. Separately, there are provided a donor substrate 34 including a light-to-heat conversion layer 32, a buffer layer 35, a metal layer 36, and a base film 31; and a transfer layer 33 formed on the donor substrate 34.

The transfer layer 33 is fabricated by coating the donor substrate 34 with a material for forming a small molecular organic thin layer. At this time, to improve various characteristics, the small molecular material may include an additive with a predetermined content. For example, a dopant may be added to the transfer layer 33 to enhance efficiency of an emission layer. As described above, the transfer layer 33 may be formed by extrusion, spin, and knife coating methods, As described above, the transfer layer 33 may be formed of a single layer or at least two layers using the small molecular organic material as necessary.

Then, the donor substrate 34 is disposed to be spaced apart from the substrate 100 having the transparent electrode layer 200 at a predetermined distance, and an energy source 57 is applied to the donor substrate 34.

The energy source 57 from a transfer apparatus passes through the base film 31 and activates the light-to-heat conversion layer 32, thereby allowing the light-to-heat conversion layer 32 to emit heat by pyrolysis reaction.

Then, the light-to-heat conversion layer 32 of the donor substrate 34 is expanded due to the emitted heat, so that the transfer layer 33 is separated from the donor substrate 34 and transferred onto the pixel region defined by the pixel defining layer formed on the substrate 100 of the organic EL display device, thereby forming the emission layer with a desired pattern and a desired thickness.

According to an embodiment of the present invention, the metal layer 36 or the modified layer 36' may be employed to enhance the interfacial characteristics between the donor substrate 34 and the small molecular transfer layer 33, in particular, the adhesion therebetween, thereby preventing the small molecular material from staining the substrate 100 of the organic EL display device 100 while the small molecular material is transferred by the laser beam.

According to an embodiment of the present invention, a laser, a xenon lamp, a flash lamp, or the like may be employed as the energy source. Among them, the laser is excellent in the transfer effect. At this time, the laser is a general laser of solid, gas, semiconductor, dye, or the like. Further, the laser beam may have various shapes such as a circular shape, or the like.

After completing the transfer process, an annealing process, i.e. a heat treatment process is performed to solidify and fix the transferred material.

Here, the transfer process may be performed once or many times. That is, in order to make the small molecular organic layer have a desired thickness, the transfer process may be performed once or many times. Preferably, the transfer process is performed once in consideration of the convenience and the stability of the process.

Figure 9:
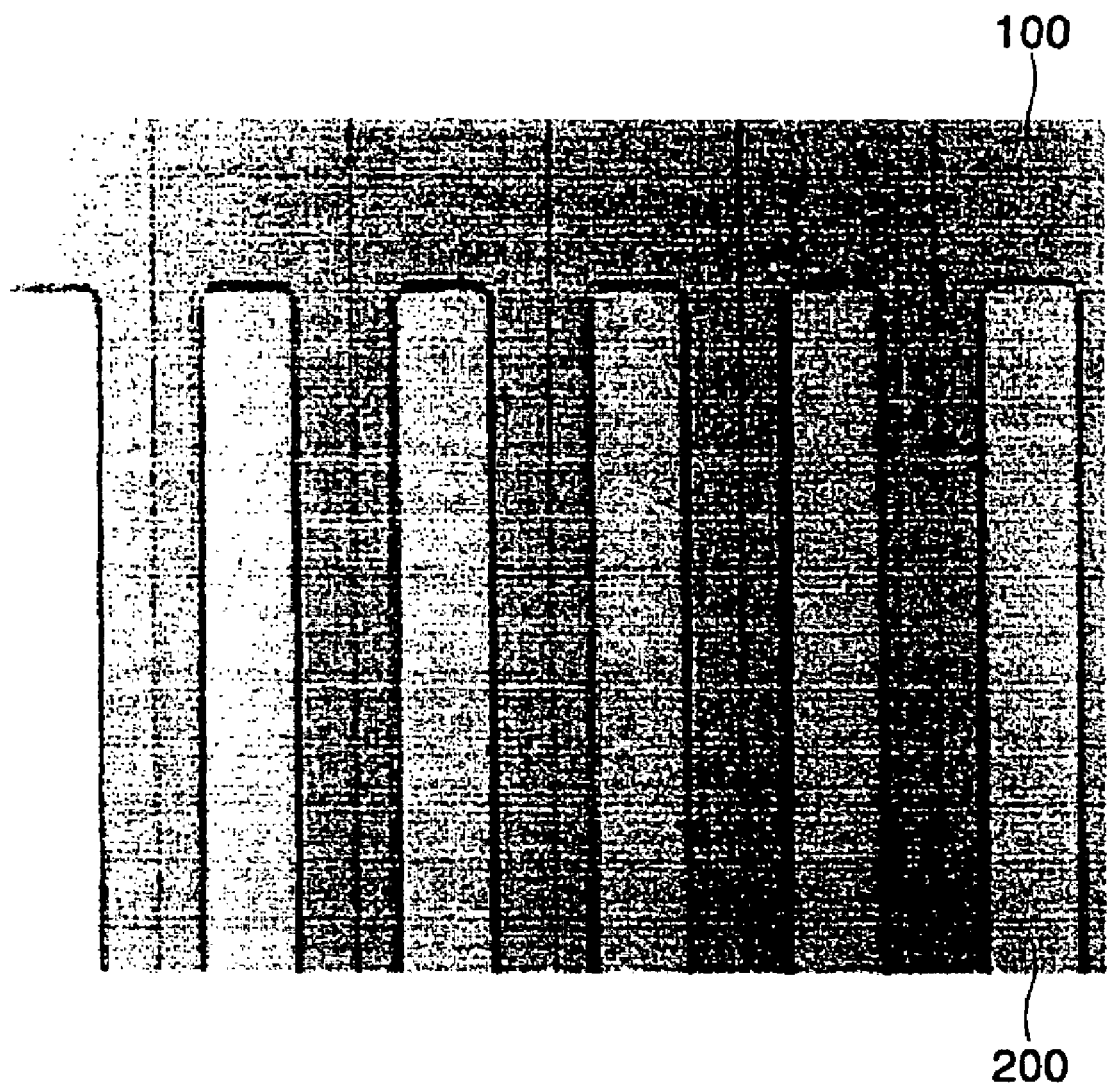
FIG. 9 is a photograph showing a pattern obtained by applying a laser induced thermal imaging method to a small molecular material using a donor substrate according to an embodiment of the present invention.

FIG. 9 is a photograph showing a pattern obtained by applying a laser induced thermal imaging method to a small molecular material using a donor substrate according to an embodiment of the present invention.

Referring to FIG. 9, the donor substrate according to an embodiment of the present invention allows a small molecular transfer material on a lower electrode 200 of a substrate 100 to be clearly patterned to thereby distinctly define the pixel region.

Figure 10:
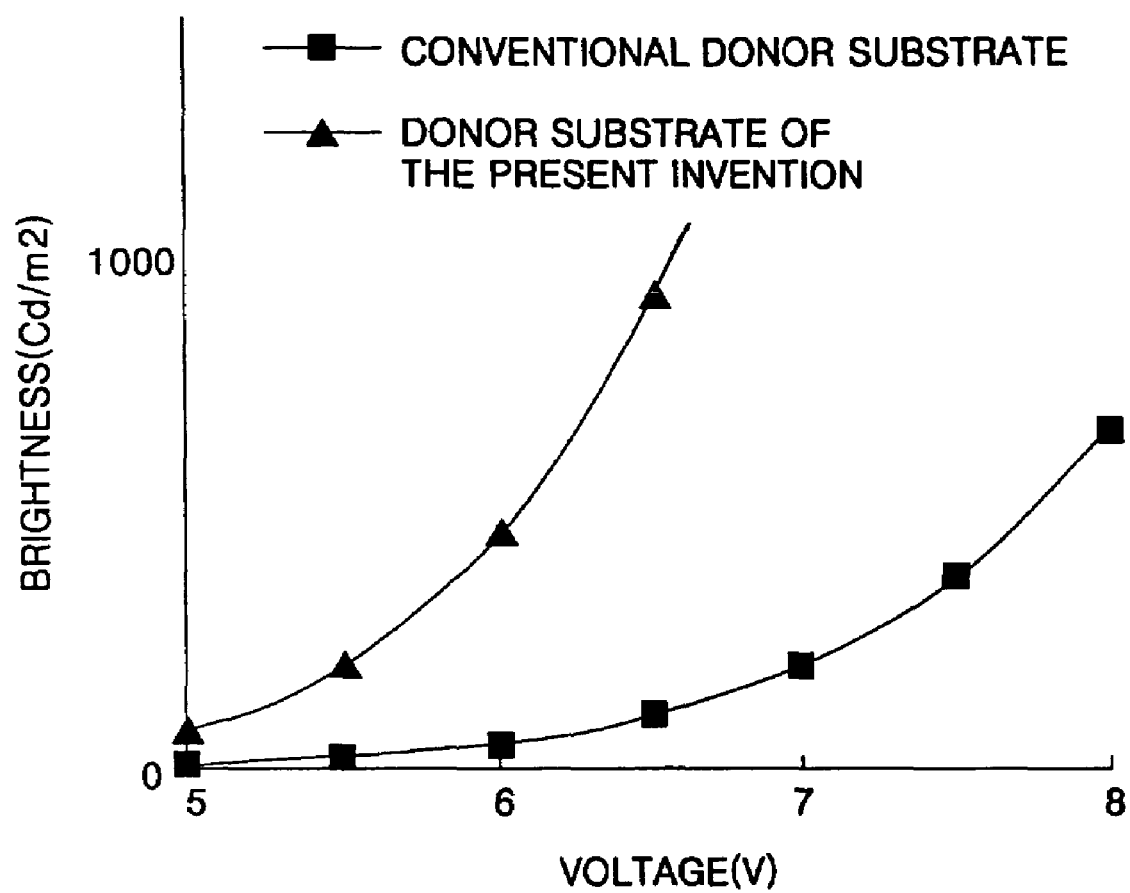
FIG. 10 is a graph showing voltage-brightness characteristics of organic EL display devices fabricated by transferring small molecular materials using the conventional donor substrate and the donor substrate according to an embodiment of the present invention, respectively.
Figure 11:
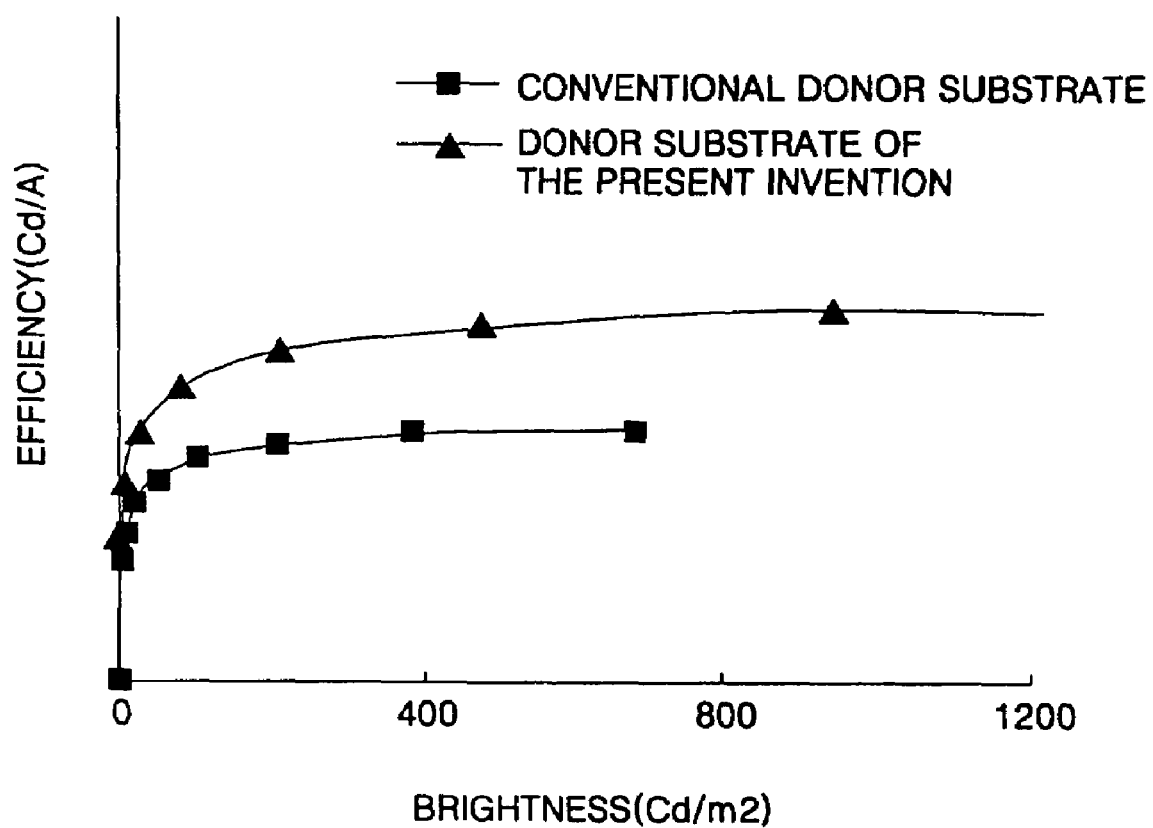
FIG. 11 is a graph showing brightness-efficiency characteristics of organic EL display devices fabricated by transferring small molecular materials using the conventional donor substrate and the donor substrate according to an embodiment of the present invention, respectively.

FIG. 10 is a graph showing voltage-brightness characteristics of organic EL display devices fabricated by transferring small molecular materials using the conventional donor substrate and the donor substrate according to an embodiment of the present invention, respectively. FIG. 11 is a graph showing brightness-efficiency characteristics of organic EL display devices fabricated by transferring small molecular materials using the conventional donor substrate and the donor substrate according to an embodiment of the present invention, respectively.

Referring to FIGS. 10 and 11, the organic EL display fabricated according to the present invention is excellent in the voltage-brightness and brightness-efficiency characteristics compared to the conventional organic EL display.

As described above, a donor substrate for a laser induced thermal imaging method includes a modified layer or a metal layer between a buffer layer and a transfer layer, so that the interfacial characteristics between the donor substrate and a small molecular material are improved, thereby enhancing the characteristics of the transferring pattern and the device.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A donor substrate for a laser induced thermal imaging method, comprising:
    a base film;
    a light-to-heat conversion layer formed on the base film;
    a buffer layer formed on the light-to-heat conversion layer;
    a metal layer formed on the buffer layer, an adhesion force between the metal layer and the buffer layer being sufficient not to release the metal layer from the buffer layer during the laser induced thermal imaging; and
    a transfer layer formed of an organic material and formed on the metal layer.

2. The donor substrate as claimed in claim 1, wherein the organic material includes a small molecular organic material.

3. The donor substrate as claimed in claim 2, wherein the small molecular organic material includes a small molecular organic electroluminescent material.

4. The donor substrate as claimed in claim 3, wherein the small molecular organic electroluminescent material is formed of one of materials represented by the following chemical formulas 1 through 4; or a small molecular phosphorescent material employing one organic metal complex including an element selected from a group consisting of Ir, Pt, Eu, and Tb together with one luminescent host material selected from a group consisting of carbazole-based, arylamine-based, hydrazone-based, stilbene-based, starburst-based, and oxadiazole-based materials;

[Chemical Formula 1]

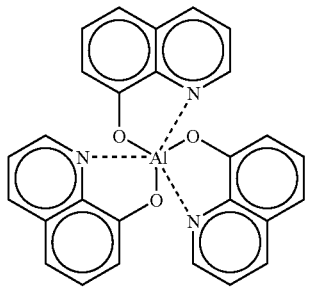

[Chemical Formula 2]

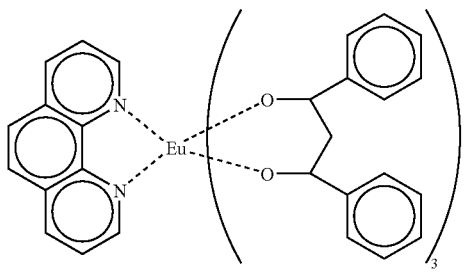

[Chemical Formula 3]

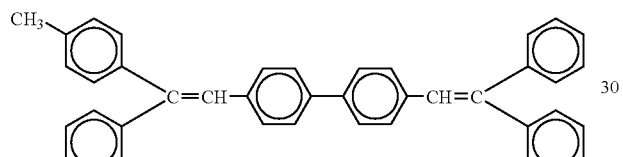

[Chemical Formula 4]

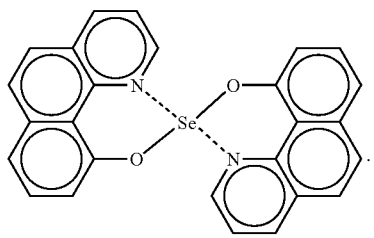

5. The donor substrate as claimed in claim 1, wherein the metal layer has a thickness of 1 μm or less.

6. The donor substrate as claimed in claim 1, wherein the metal layer has a transmissivity of 20% or less with regard to a laser beam.

7. The donor substrate as claimed in claim 6, wherein the metal layer includes one selected from a group consisting of Al, Ag, Cr, Sn, Ni, Ti, Co, Zn, Au, Cu, W, Mo, and Pb.

8. The donor substrate as claimed in claim 1, further comprising a gas generating layer formed beneath the light-to-heat conversion layer.

9. An organic electroluminescent display device fabricated using the donor substrate as claimed in claim 1.

10. The donor substrate as claimed in claim 1, wherein the metal layer is formed of aluminum metal or silver metal.

11. A donor substrate for a laser induced thermal imaging method, comprising:
a base film;
a light-to-heat conversion layer formed on the base film;
a buffer layer formed on the light-to-heat conversion layer; and
a modified layer formed on the buffer layer, the modifying layer modifying a surface of the buffer layer to enhance an adhesion between the transfer layer and the buffer layer, an adhesion force between the modified layer and the buffer layer being sufficient not to release the modified layer from the buffer layer during the laser induced thermal imaging;
a transfer layer formed on the modifying layer.

12. The donor substrate as claimed in claim 11, wherein the transfer layer is formed of a small molecular organic material layer.

13. The donor substrate as claimed in claim 12, wherein the small molecular organic material layer includes a small molecular organic emission layer.

14. The donor substrate as claimed in claim 13, wherein the small molecular organic emission layer is formed of one of materials represented as the following chemical formulas 1 through 4; or a small molecular phosphorescent material employing one organic metal complex including an element selected from a group consisting of Ir, Pt, Eu, and Tb together with one luminescent host material selected from a group consisting of carbazole-based, arylamine-based, hydrazone-based, stilbene-based, starburst-based, and oxadiazole-based materials;

[Chemical Formula 1]

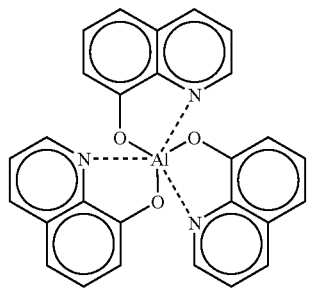

[Chemical Formula 2]

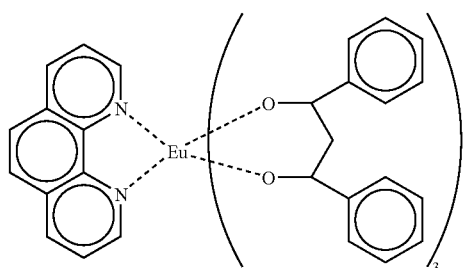

[Chemical Formula 3]

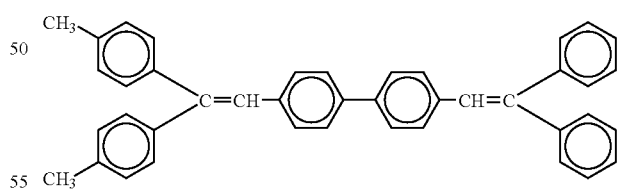

[Chemical Formula 4]

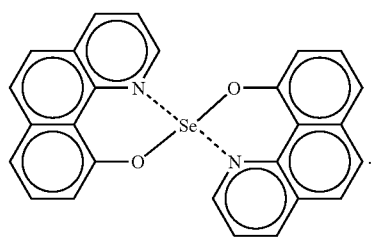

15. The donor substrate as claimed in claim 11, wherein the modified layer has a transmissivity of 20% or less with regard to a laser beam.

16. The donor substrate as claimed in claim 15, wherein the modified layer is formed of metal.

17. The donor substrate as claimed in claim 15, wherein the modified layer is formed of one selected from a group consisting of Al, Ag, Cr, Sn, Ni, Ti, Co, Zn, Au,

18. The donor substrate as claimed in claim 11, wherein the modified layer has a thickness of 1 μm or less.

19. An organic electroluminescent display device fabricated using the donor substrate as claimed in claim 1.

20. The donor substrate as claimed in claim 10, wherein the metal layer is formed of aluminum metal or silver metal.

* * * * *